United States Patent [19]

Valero et al.

[11] Patent Number: 4,866,445
[45] Date of Patent: Sep. 12, 1989

[54] METHOD AND PROGRAMMABLE DEVICE FOR TRANSCODING CHARACTER STRINGS

[76] Inventors: Robert Valero, 10 Alleée de Epines, 78180 Montigny le Bretonneun; Jean-Pierre Mounier, 2, rue des Faborites, 75015 Paris; Yves Berruyer, 94, boulevard Gabriel Péri, 92240 Malakoff, all of France

[21] Appl. No.: 137,141

[22] Filed: Dec. 23, 1987

[30] Foreign Application Priority Data

Dec. 23, 1986 [FR] France .................. 86-18099

[51] Int. Cl.⁴ .................. H03M 7/42; H03M 7/20
[52] U.S. Cl. .................. 341/106; 341/67; 341/78; 341/102
[58] Field of Search .................. 341/67, 78, 95, 102, 341/106

[56] References Cited

U.S. PATENT DOCUMENTS 3,701,111 10/1972 Cocke et al. .................. 341/67
3,925,780 12/1975 Van Voorhis .................. 341/67
4,644,545 2/1987 Gershenson .................. 341/106

Primary Examiner—William M. Shoop, Jr.
Assistant Examiner—Gary J. Romano
Attorney, Agent, or Firm—Lowe, Price, LeBlanc, Becker & Shur

[57] ABSTRACT

Programmable transcoding device which sequences of binary words of variable lengths corresponding to strings of characters in a first alphabet are transcoded into other sequences of binary words intelligible in a second alphabet. The device is connected to digital systems exchanging sequences of words via interfaces provided with files. A CPU connected to the interfaces via a switching device receives the incoming sequences, and delivers transcoded outgoing sequences of binary words. An exchange management unit monitors the data transfers in the device and regulates the flows of words between the device and the digital systems. A terminal or microcomputer can also equip the device so as to produce transcoding tables to be downloaded in an RAM of the CPU.

5 Claims, 3 Drawing Sheets

METHOD AND PROGRAMMABLE DEVICE FOR TRANSCODING CHARACTER STRINGS

BACKGROUND OF THE INVENTION

1. Field of the Invention

The present invention pertains generally to problems of character and instruction message encoding incompatibility that may arise between two different data processing systems when they have to communicate together. For example, one of the systems is a microcomputer or terminal knowing a given character alphabet and message structure and the other is a central electronic system knowing different alphabets and message structures.

2. Description of the Prior Art

At present a broad range of terminals, microcomputers and electronic systems are available which do not always use the same character alphabet, the same exchange protocol to transmit and receive, or the same message structure. This incompatibility between these different equipments often makes it impossible to interconnect them in order to produce higher level equipment or systems.

Equipments which should be compatible and adaptable are often in fact incompatible, such as terminals mostly equipped with a keyboard having keys determining program functions to which encoding combinations are attributed, fixed arbitrarily by the manufacturer. Certain terminals make use of specific order codes, respectively for their internal management and management of devices connected to them. These terminals connected to a central electronic system, not knowing the same order codes, operate incompletely. Moreover, the constant evolution in data processing techniques contributes to the development of different types of terminal, notably color display terminals, thus making incompatibility problems more difficult.

With the existing standardization, standard exchange protocols are available, such as the ANSI, VT52, VT100 or the videotex standard. These protocols have the advantage of making the equipments adaptable for certain types of exchanges but very often reduce the area of use of the high performance equipments.

Moreover, the range of existing standardized alphabets is evolving perpetually in order to meet the different national requirements and adapt to the new technological possibilities. Thus different binary encoding combinations can correspond to the same character, according to the standardized alphabet used.

OBJECT OF THE INVENTION

The main object of this invention is to provide a method and transcoding devices to solve the incompatibility problems referred to above.

Another object of the invention is to provide transcoding devices which can be programmed such as they can be used in order to resolve different encoding incompatibilities.

An incoming message to be transcoded transmitted by a first digital data processing system to a second digital data processing system can consist of one or several binary words corresponding respectively, in a first alphabet associated to said first system, to a character or string of characters to which generally a determined entity or determined significance correspond. This incoming message can be transcoded into no message, if it has no significance or equivalent for the second system, or into a transcoded outgoing message made of one or several binary words corresponding respectively in a second alphabet associated to the second system, to a character or string of characters.

Therefore, still another object of the invention is to provide transcoding devices designed for processing messages of differents lengths. These transcoding devices must be able to transcode incoming messages of any length into transcoded outgoing messages of any length.

SUMMARY OF THE INVENTION

According to the objects, the method is designed to transcode incoming messages having different lengths into transcoded outgoing messages having different lengths, any one incoming message being composed of N ordered incoming binary words, N being a variable integer greater than or equal to 1 and representing the length of said incoming message, and any one any transcoded outgoing message being composed of M ordered outgoing binary words, M being a variable integer greater than or equal to 0 and representing the length of said transcoded outgoing message. Each incoming binary word is used to address in a corresponding transcoding table associated to a rank n of the incoming binary word in the incoming message, where n is an integer between 1 an N, a transcoding word including a first field and a second field. In the transcoding table associated to the rank n equal to 1, the first field is an indicator identifying the second field as being a transcoded outgoing message having a length M equal to 1 and corresponding to an incoming message having a length N equal to 1, or as being an address in a table of transcoded outgoing messages relative to a transcoded outgoing message having a length M different from 1 and corresponding to an incoming message having a length N equal to 1, or as being an address of the transcoding table associated to the rank n equal to 2. In the transcoding tables associated respectively to ranks n different from 1, the first field is an indicator identifying the second fields as being an address in said transcoded outgoing messages table relative to a transcoded outgoing message corresponding to an incoming message having a length N greater than 1, or as being an address of the transcoding table associated to the rank n+1, or as being a failure code when the incoming message is not to be transcoded.

A transcoding device designed to implement the process as embodied by the invention comprises:
first and second interfacing means for connecting the device respectively to first and second incompatible digital systems having to communicate together, via links through which the transcoded incoming and outgoing messages transit;
processing means comprising transcoding tables and a programmed algorithm for identifying the incoming messages thereby delivering the transcoded outgoing messages corresponding to said incoming messages;
switching means for connecting alternately the first and second interfacing means to the processing means thereby the processing means receiving the incoming messages from the interfacing means and transmitting in response the corresponding transcoded outgoing messages to said interfacing means; and exchange management means for managing the interfacing means and the switching means in terms of a control binary word delivered from the processing means and thereby regulating the rate of messages exchanged between the device and said systems in terms of data supplied by the interfacing means.

The method embodying the invention offers the following main advantages:

It is not necessary that the strings of characters to be transcoded should include delimiting characters indicating the beginning and end of the string.

The time for transcoding an incoming message is negligible. In fact, owing to the use of transcoding tables containing pre-computed values, the transcoding operations are simple and only consist of shifts, comparisons, and reads and writes in the tables. This simplicity of the transcoding operations also results from a transcoding process in character mode, i.e. each character entered into the transcoding device advances the transcoding process by one step, as opposed to the processing of characters in block mode;

The use of relative or indexed addressing modes contributes to optimizing the memory space required for processing, so that in most cases it is possible to use an 8-bit microprocessor.

It is possible to identify the characters or strings of characters imbricated in character strings of greater size.

The increase in performances, as to the quantity of characters, or of strings of characters, different transcodable by a transcoding device according to the invention only depends on the available memory space in said transcoding device.

The last two advantages referred to also mean that the use of the invention can be considered for cyphering purposes.

BRIEF DESCRIPTION OF THE DRAWING

The foregoing and other objects, features and advantages of the invention will be apparent from the following detailed description of several preferred embodiments of the invention with reference to the corresponding accompanying drawings in which.

DESCRIPTION OF THE PREFERRED EMBODIMENTS

In the description of the structure and operation of a unidirectional programmable transcoding device AT embodied by the invention, consider, as an example, unidirectional transcoding to be obtained between a first digital data processing system S1 transmitting messages and a second digital data processing system S2 waiting for these messages. As from an unidirectional transcoding device, the professional can obtain a bidirectional transcoding device, by doubling the transcoding tables and providing for shared time processing for both transmission directions and for control on the overall flow of the device.

The first and second systems S1 and S2 use respectively first and second determined alphabets consisting mostly of editable characters and controls to which binary words with a determined number of bits B correspond, all possible binary combinations of B bits can be used by the alphabets.

For example the controls are utility controls such as "action of the buzzer", "carriage return", and "line feed" noted respectively "BEL", "CR", and "LF" in most of the existing standardized alphabets. Subsequently in the description the term of character is used, as is normal practice, indifferently for an editable character or for a control.

Figure 1:
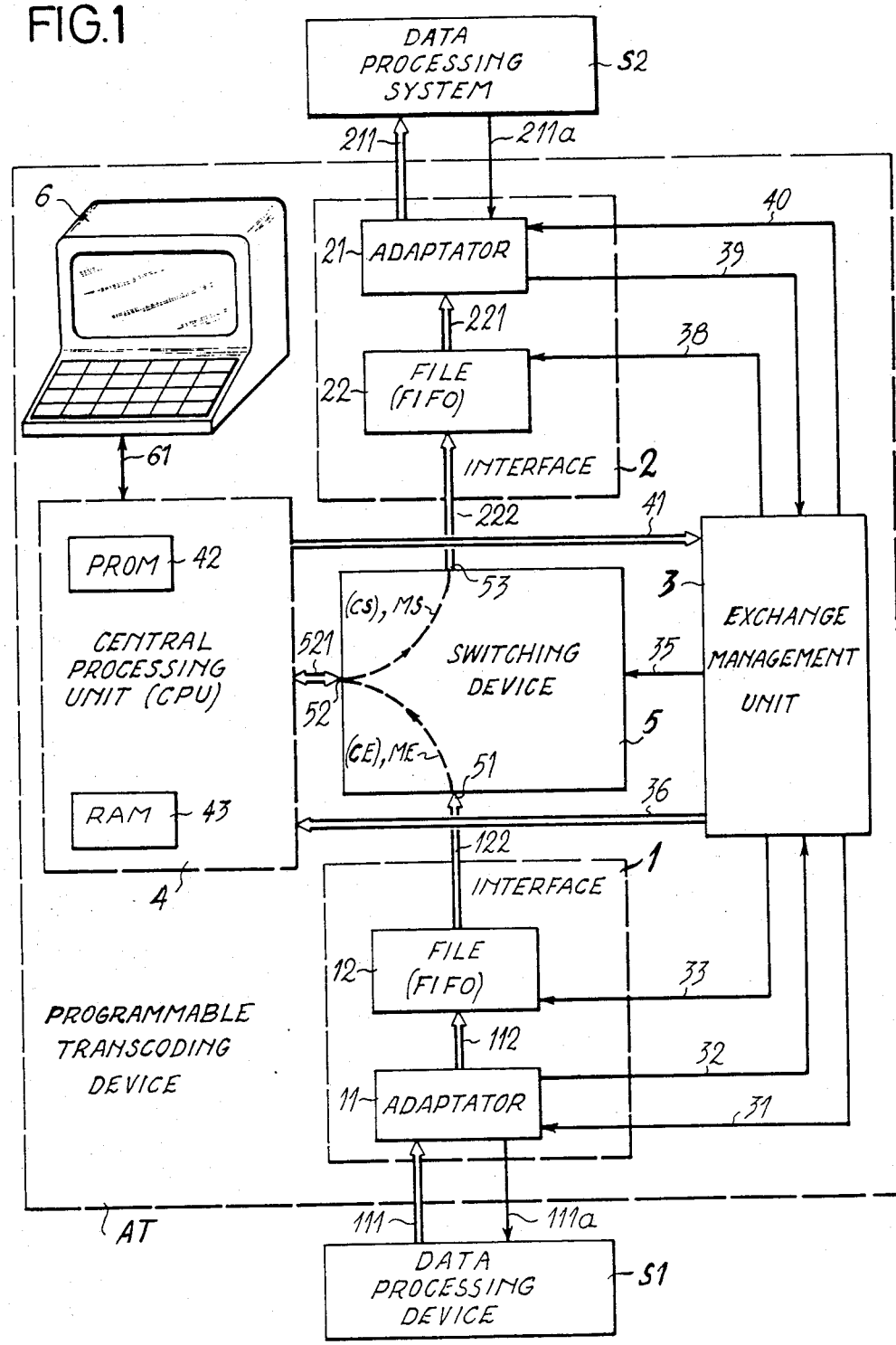
FIG. 1 is a functional block diagram of a unidirectional programmable transcoding device embodying the invention.

Referring to FIG. 1, system S1 transmits to the programmable transcoding device AT incoming messages ME via a unidirectional data transmission link 111. An incoming message consists of a single incoming word (CE) or a sequence of N binary incoming word [(CE$_1$), (CE$_2$), ... (CE$_n$), ... (CE$_N$)], N being a variable integer that can vary from 1 to a maximum predetermined integer number Nmax and that represents the length of the incoming message. To each of the incoming words in a sequence of words a rank n corresponds, n being an integer comprised between 1 and N, representing its chronological order of arrival in the transcoding device AT in relation to the first word identified (CE$_1$) of the incoming sequence. In the alphabet of the system S1, characters CE and CE$_1$, CE$_2$, ... CE$_n$, ... CE$_N$ respectively correspond to the incoming words (CE) and (CE$_i$), (CE$_2$), ... (CE$_n$), ... (CE$_N$).

Each incoming word is received in the transcoding device AT by an input interface 1 via the transmission link 111. A dialogue link 111a is provided between system S1 and the interface 1 so that it can invite system S1, in case of need, to suspend the transmission. This dialogue link 111a can be suppressed by the use of control characters, which can be "XON" and "XOFF" characters, to enable and suspend the transmission respectively. The control characters "XON" and "XOFF" are then transmitted to system S1 via transmission link 111 which is in this case bidirectional.

Interface 1 contains an input adaptor 11 and a file 12. The input adaptor 11 is used to adapt the data transmission link 111, which can be a series or parallel type, to the internal buses of the transcoding device AT. For example, in the case of a series type transmission link 111, the adaptor 11 can be a circuit specialized for this type of transmission, such as a Universal Asynchronous Receiver Transmitter UART, or more simply a series/-parallel register; in the case of a parallel transmission link 111, input buffer memories can be suitable.

File 12 receives the incoming words delivered by adaptor 11 in parallel format via a bus 112. File 12 is an FIFO (First in, First out) storage register.

For each incoming word (CE) received, adaptor 11 delivers via a link 32, a word detection signal to an exchange management unit 3. The incoming word (CE) is then presented on output on bus 112 linked to the input of file 12. Management unit 3 being informed, via link 32, of the arrival of a word, a storage control signal is applied to file 12, by a link 33, to store the incoming word (CE) present in bus 112 in file 12.

Means of processing and control are included in the transcoding device AT in the form of a central processing unit (CPU) 4. CPU 4 comprises a PROM 42 containing microinstructions to execute a transcoding algorithm and control the exchange management unit 3. CPU 4 delivers control words to management unit 3 via a control bus 41. CPU 4 is constantly informed of the status of the transcoding device by a status word delivered by unit 3 in status bus 36. CPU 4 being ready to read an incoming word (CE) stored in file 12, so as to apply a transcoding method, it transmits to the exchange management unit 3 a control word by control bus 41. Unit 3 decodes this control word, generates a signal by link 33 to indicate to file 12 to present on an output bus 122 connected to an input 51 of a switching device 5, the first incoming word (CE) in chronological order of arrival. The word (CE) being present in bus 122, the unit 3 then supplies to the switching device 4, a signal via link 35, to control the connection of input 51 on an input/output 52 of switching device 5. Input/output 52 is connected to the CPU 4 by a data bus 521. CPU 4 reads the incoming word (CE) presented on bus 521.

The incoming word (CE) is identified in CPU 4 via transcoding tables contained in a RAM 43.

The incoming word (CE) can be identified as having no corresponding transcoded outgoing message, in which case, it is not acquired. CPU 4 then controls read of the next incoming word in file 12 in the way just described, transmitting a control word to exchange management unit 3 by bus 41.

The incoming word (CE) can be identified as being the first word ($CE_1$) in a sequence of N incoming words known to CPU 4. CPU 4 then proceeds to read and identify the next words in the incoming sequence.

A transcoded outgoing message MS consisting of an outgoing word (CS) or a sequence composed of M transcoded outgoing words $[(CS_1), (CS_2), \ldots (CS_m), \ldots (CS_M)]$ where m is an integer comprised between 1 and M, and M is a variable integer generally different from the integer N which can vary from 0 to a maximum predetermined number Mmax and which represents the length of the outgoing message MS, can correspond to the incoming work (CE) or to the sequence of N incoming words $[(CE_1), (CE_2), \ldots (CE_n), \ldots (CE_N)]$ composing an incoming message ME.

In the case in which a transcoded outgoing message MS corresponds to the incoming message ME consisting of the incoming word (CE) or the sequence of N incoming words, CPU 4 supplies to exchange management unit 3 another control word by bus 41 so as to control the routing of each of the four outgoing words of message MS to an output interface 2 transmitting transcoded outgoing words (CS) via a transmission link 211, to the second system S2. On receiving the control word, unit 3 commands the connection of the input/output 52 of switching device 5 with an output 53 of the same device 5, by activating the control link 35. Output 53 is connected by a bus 222 to the input of a file 22, similar to file 12, included in the output interface 2. Each of the outgoing words transferred is stored in file 22, in answer to a control signal delivered by unit 3 via a control link 38, with other transcoded outgoing words to be transmitted to system S2.

Apart from file 22, output interface 2 comprises an output adaptor 21 connected on output to the second system S2 by a transmission link 211 and a dialogue link 211a. Link 211a can, in the same way as dialogue link 111a, be suppressed by the use of the control characters already referred to as "XON" and "XOFF". The task of adaptor 21, in the same way as input adaptor 11, is to adapt the internal buses of the transcoding device to the unidirectional transmission link 211, which can be, in the same way as link 111, either series or parallel type. A link bus 221 supplies transcoded outgoing words from file 22 on input of adaptor 21. When adaptor 21 is ready to transmit an outgoing word (CS) stored in file 22, it indicates this to the exchange management unit 3 by a link 39. Unit 3 then orders, via link 38, file 22 to present on output on bus 221 an outgoing word (CS). The outgoing word (CS) is read by adaptor 21 which transmits it via link 211 to system S2.

The exchange management unit 3 manages and monitors the signals exchanged between the different circuits of the transcoding device and also between the transcoding device and systems S1 and S2. Unit 3 receives from CPU 4 a control word, pertaining to the data exchanges within the transcoding device, from which are created the different control signals sent to interfaces 1 and 2 through links 31, 33, 38, and 40, and to the switching device 4 through link 35. A status word is supplied by the unit 3 to CPU 4, via bus 36, to inform it of all changes occuring in the communication with system S1 or S2.

Two write and read counters and a comparator associated to each of the two files 12 and 22 are provided, in known fashion, in exchange management unit 3, so as to determine the respective filling level of each of the file and compare said levels to upper and lower filling limits defined so as to regulate the data flows, firstly between system S1 and transcoding device AT and secondly between transcoding device AT and system S2, which generally are different.

A data flow check can b managed from the upper and lower limits, for each of the files 12 and 22, contingent on a hysteresis cycle designed to avoid a reduction in the performances of the device when oscillating around a single filling limit. Thus, when the file, 12 or 22, reaches a filling level at least equal to the upper limit, a detection is made by the associated comparator and exchange management unit 3 suspends the filling of the file involved by halting transmission and word write in the file. Unit 3 authorizes word write again in the file, when the filling level becomes less than or equal to the lower limit. Management of the hysterisis cycles by unit 3 is obtained by two filling indicators, one for each of the files, included in the unit 3. A filling indicator can take on two states, a "filling suspension" status when unit 3 detects a filling level equal to or greater than the upper limit for the corresponding file. An indicator turns to "normal operating" status when unit 3 detects a filling level equal to or less than the lower limit of the corresponding file.

Overranging the upper limit in file 22 produces transmission of a status word designed for CPU 4, via status bus 36. CPU 4 then suspends, via bus 41, outgoing word writes in file 22 and all read requests for words stored in file 12. Overranging of the upper limit in file 12 entails activation of link 111a to system S1 so as to halt the transmission of incoming words. For this purpose the exchange management unit 3 is connected to adaptor 11, by control link 31. A filling level of file 22 less than or equal to the lower limit produces, if the filling indicator associated to file 22 was positioned in "filling suspension" status, transmission of a status word to CPU 4, via status bus 36. CPU 4 then resumes the outgoing words write in file 22 and the read requests for words stored in file 12.

A filling level of file 12 less than or equal to the lower limit Produces, if the filling indicator associated to file 12 was positioned in "filling suspension" status, transmission of a control on link 31 designed to deactivate link 111a.

Link 211a between system S2 and adaptor 21 is provided so that S2 requests to suspend, i.e. halt or postpone, a transmission of outgoing words, for example, after a failure or filling of buffer memories in system S2. This suspension request is transmitted by adaptor 21 to unit 3, which validates it by delivering to adaptor 21, via link 40, a transmission halt control to system S2. The transcoding device continues to operate with system S1 until a possible halt caused by overranging the upper limit in file 12.

When the suspension request vanishes on link 211a, adaptor 21 informs unit 3 of this, which retrieves this new status and delivers to adaptor 21, via link 40, a permission to transmit to system S2.

The operating of the means relating to the data flow check described in the previous paragraphs corresponds to unidirectional transmission without echo mode. In the case of a more complex transmission, the mechanisms necessary to the data flow check are more highly developed, nevertheless the hysteresis together with a different means described, are preserved.

The transcoding tables are downloaded in RAM 43 in CPU 4 during a prior initialization phase, previous to the setting into operation of the transcoding device. For this purpose a link 61 is provided between CPU 4 and a microcomputer 6 having been used to produce tables from an analysis of character alphabets of systems S1 and S2, for the different possibilities of communication between these systems, together with the possible conflicts that may arise between them. Moreover, the microcomputer can be used to display data transmitted by CPU 4 during the transcoding operations, liable to interest an operator.

In the following paragraphs, in relation with FIG. 2, a simplified organization of the transcoding tables is described.

The CPU 4 generally proceeds, in order to address the different transcoding tables, according to the so-called relative addressing and indexed addressing modes. The relative addressing mode consists in supplying to a processor, an address word corresponding to a shift to be made generally in relation to the value of a program counter so as to obtain an effective address in a memory area. In the indexed addressing mode, the address word is supplied to the processor with the address of a so-called index register containing a value to be added to the address word to obtain an effective address. The index is located in RAM and can be modified during the program, thus enabling highly flexible addressing. The relative and indexed addressing modes are frequently employed to address tables, because they provide for simple conversion of data item into an address in a table that can be located indifferently in a memory area.

The transcoding tables include input tables $TE_1$ to $TEN_{max}$, a message table TM, an index table ITE for addressing input tables, and an index table ITM for addressing the message table.

Input tables $TE_1$ to $TE_{Nmax}$ carry a logical identification tree structure of incoming messages. This tree structure comprises different routing possibilities terminating in the identification of isolated incoming words or a sequence of incoming words known by the transcoding device.

Each of the input tables $TE_1, TE_2, \ldots TE_n, \ldots TE_N, \ldots TE_{Nmax}$ is located in RAM by a start address $(TE_1), (TE_2), \ldots (TE_n), \ldots (TE_{Nmax})$ respectively.

Only input table $TE_1$ amongst all the input tables is used to transcode an isolated incoming word (CE) or (CE'). Transcoding of a sequence of N incoming words makes use of input tables $TE_1$ to $TE_N$. The incoming words $(CE_1), (CE_2), \ldots (CE_n), \ldots (CE_N)$ address in the input tables $TE_1, TE_2, \ldots TE_n, \ldots TE_N$, in relation to the start addresses $(TE_1), (TE_2), \ldots (TE_n), \ldots (TE_N)$, transcoding words $Mt_1, Mt_2, Mt_n, \ldots Mt_N$ respectively. Input tables $TE_2$ to $TE_{Nmax}$ are only used to transcode incoming messages which can correspond to more than one outgoing word, their function being different from that of input table $TE_1$, they can also be referred to as "cross-reference tables".

Each of the input tables comprises as many transcoding words as there are different incoming words that can be delivered by system S1, i.e. $2^{B-1}$ transcoding words, assuming that each incoming word contains B bits, typically 8 bits broken down into two half-bytes in hexadecimal digital base. A character noted "NUL" in most of the standardized alphabets corresponds to an incoming word with a value noted "$00_H$" in hexadecimal digital base. The NUL character, although often dealt with as any other character, is used in the input tables, or cross-reference tables, $TE_2$ to $TE_{Nmax}$ to retrieve incoming messages of greater length.

Each of the transcoding words $Mt_n$ comprises $B+1$ bits and is divided into first and second fields ch1 and ch2. The first field ch1 is an identification indicator; it consists of the most significant bit MSB of the transcoding word $Mt_n$. The second field ch2 consists of the B remaining bits. Field ch2 is generally an address used by the CPU to continue the transcoding process; in input table $TE_1$, it can also be a transcoded outgoing word (CS).

The messages table TM is located in RAM by a table start address (TM). Transcoded outgoing messages consisting of outgoing words each of B bits are stored in table TM. A transcoded outgoing message MS is preceded in table TM by the number M of outgoing words contained in this message. The number M and the outgoing words $(CS_1), (CS_2), \ldots (CS_m), \ldots (CS_M)$ of a message MS are respectively stored in memory at addresses AM and AM+1, AM+2, ... AM+m, ... AM+M in relation to address (TM).

To read an outgoing message MS, only the address AM is supplied to the CPU; the latter reads the number M in order to deduce the address AM+M of the last word of the outgoing message. The outgoing words are then read successively from address AM+1, start of message, to address AM+M, end of message. If the number M is equal to zero, no outgoing message corresponds to the incoming message.

The index table ITE is an intermediate table used by the CPU to address a transcoding word $Mt_n$ in an input table $TE_n$; it contains the table start addresses $(TE_1)$ to $(TE_{Nmax})$ of input tables $TE_1$ to $TE_{Nmax}$. The table ITE is located in memory at a table start address (ITE). Each of the table start addresses $(TE_1)$ to $(TE_{Nmax})$ is located in the index table ITE by an address, $A_1$ to $A_{Nmax}$ respectively.

The index table ITM is an intermediate table used by the CPU to address the transcoded outgoing messages MS' in the message table TM from transcoding words Mt' of input table $TE_1$. Table ITM is located in RAM by the table start address (ITM).

Figure 2:
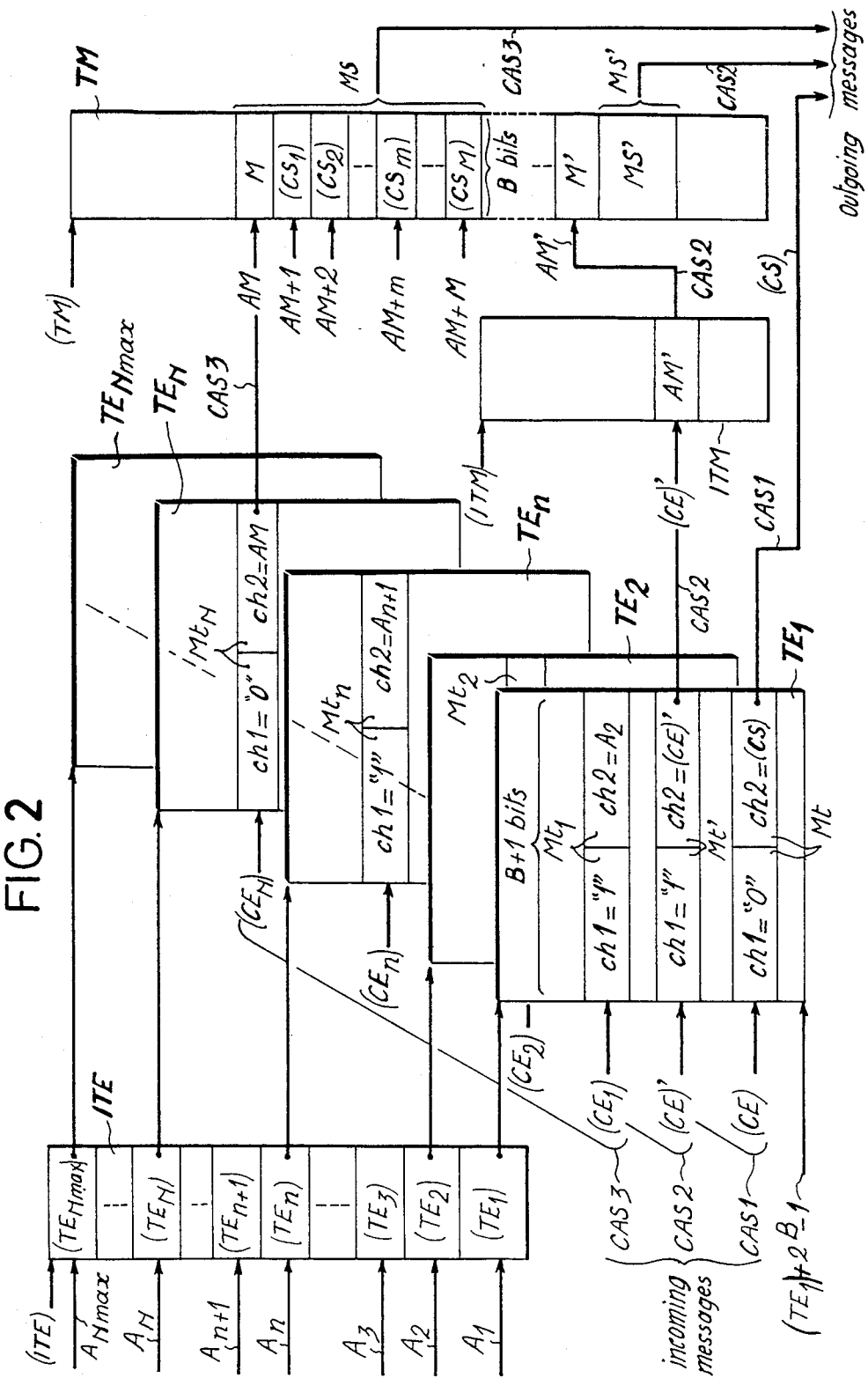
FIG. 2 is a chart showing a simplified organization of transcoding tables included in a transcoding device designed to implement the method embodying the invention.

FIG. 2 shows the use of the transcoding tables by the CPU in three typical transcoding processing cases.

According to a first typical case CAS1, a transcoded message consisting of a single transcoded outgoing word (CS) corresponds to an incoming message consisting of a single incoming word (CE). The incoming word (CE) addresses in table $TE_1$, in relation to the table start address ($TE_1$), a transcoding word Mt. Field ch1 of word Mt to binary status "0" indicates to the CPU that the second field ch2 of word Mt is the transcoded outgoing word (CS).

According to a second typical case CAS2, a transcoded outgoing message MS' having a length M' different from 1 corresponds to an incoming message consisting of a single incoming word (CE'). Fields ch1 and ch2 of a transcoding word Mt' selected by the word (CE') are then respectively to binary status "1", as opposed to the previous case CAS1, and equal to the incoming word (CE'). The CPU uses the word (CE') to address in the index table ITM an address word AM'. The word AM' read by the CPU is, in the message table TM, the address of the message MS' corresponding to the word (CE').

According to a third typical case CAS3, a transcoded outgoing message MS comprising a sequence of M outgoing words [($CS_1$), ($CS_2$), ... ($CS_m$), ... ($CS_M$)], corresponds to an incoming message consisting of a sequence of N incoming words [($CE_1$), ($CE_2$), ... ($CE_n$), ... ($CE_N$)].

The first incoming word ($CE_1$) selects in the input table $TE_1$ a transcoding word $Mt_1$ with a first field ch1 to binary status "1". The second field ch2 of the word $Mt_1$ is different from the incoming word ($CE_1$) as opposed to the previous case CAS2, thus enabling the CPU to identify the word ($CE_1$) as being the first word in a known incoming sequence of words. Field ch2 of word $Mt_1$ is equal to address $A_2$ situating the table start address ($TE_2$) in index table ITE. A second incoming word ($CE_2$) then selects in table $TE_2$, in relation to table start address ($TE_2$) read in the index table ITE, a second transcoding word $Mt_2$ with a first field ch1 to binary status "1". Field ch1 of word $Mt_2$ to binary status "1" confirms the identification route followed and indicates to the CPU that a third incoming word ($CE_3$) is expected. Field ch2 of word $Mt_2$ is the address $A_3$ situating in the ITE table, the table start address ($TE_3$) of the input table $TE_3$.

The incoming word ($CE_3$) is used in a way similar to the word ($CE_2$) to select in the input table $TE_3$ a transcoding word $Mt_3$ whose field ch1 to binary status "1" indicates that the CPU should continue the same process, up to the incoming word ($CE_N$). The incoming word ($CE_N$) selects in the table $TE_N$ a transcoding word $Mt_N$ whose field ch1 to binary status "0" enables the CPU to identify the word ($CE_N$) as being the last word in the known sequence. Field ch2 is then equal to an address AM of messages table TM is read by the CPU so as to address in table TM the corresponding transcoded outgoing message MS. The number M of message words stored in table TM at address AM is comprised between 0 and $M_{max}$. For a corresponding message MS, with a single word, the number M is equal to 1. A single outgoing word ($CS_1$) is thus read, at address AM+1.

An incoming word following the word ($CE_N$) again addresses input table $TE_1$.

Case CAS3 just described, concerns a path in the input tables $TE_1$ to $TE_{Nmax}$ terminating directly in the identification of a sequence of incoming words as being an incoming message to be transcoded known to the CPU. Nevertheless, after an incoming word ($CE_n$) identified as the $n^{th}$ incoming word in a known sequence of words, an incoming word can occur ($CE_{n+1}$) which is not the $(n+1)_{th}$ word expected in the known sequence of incoming words. The incoming word ($CE_{n+1}$) then addresses in input table $TE_{n+1}$ a transcoding word $Mt_{n+1}$ with a determined value, for example "$OO_H$".

The value "OOH" thus determined is, for the CPU, a failure code indicating to it, in view of the last incoming word ($CE_{n+1}$), either a failure in the transcoding or the existence of a longer known message. The CPU then initializes the transcoding words $Mt_1$ to $Mt_{n+1}$ with new values contained in a table associated to the input tables. A new transcoding attempt is made from incoming words ($CE_1$) to ($CE_{n+1}$) previously saved in a table of incoming words. The table associated to the input tables contains the different transcoding words possible at the same address in an input table; these different words correspond to different routing possibilities. Different routing possibilities can be tried by the CPU before resulting in the transcoding of the words ($CE_1$) to ($CE_p$), where p is an integer greater or equal to 1, by one or several transcoded outgoing messages.

Other transcoding table organizations are possible in order to adapt transcoding to be obtained to the forcibly limited addressing possibilities of the CPU and can provide great flexibility in the choice of values allocated to address words, in relation to the different possible values of the incoming words.

The size of the input tables $TE_2$ to $TE_{Nmax}$ described above can be substantially reduced by the uses of index tables.

In fact, an incoming word ($CE_p$) addressing an input table ($TE_p$) where p is an integer comprised between 2 and Nmax, an identified successfully, i.e. identified as duly being $p^{th}$ incoming word of the expected word sequence, is generally comprised between a minimum incoming word ($CE_{pmin}$) and a maximum outgoing word ($CE_{pmax}$) resulting in successful identifaction by table $TE_p$. An index table $ITE_p$ associated to table $TE_p$ containing the words ($CE_{pmin}$) and ($CE_{pmax}$) and used to address table $TE_p$ limits the size of the input table $TE_p$ to the number of words comprised between ($CE_{pmin}$) and ($CE_{pmax}$).

Figure 3:
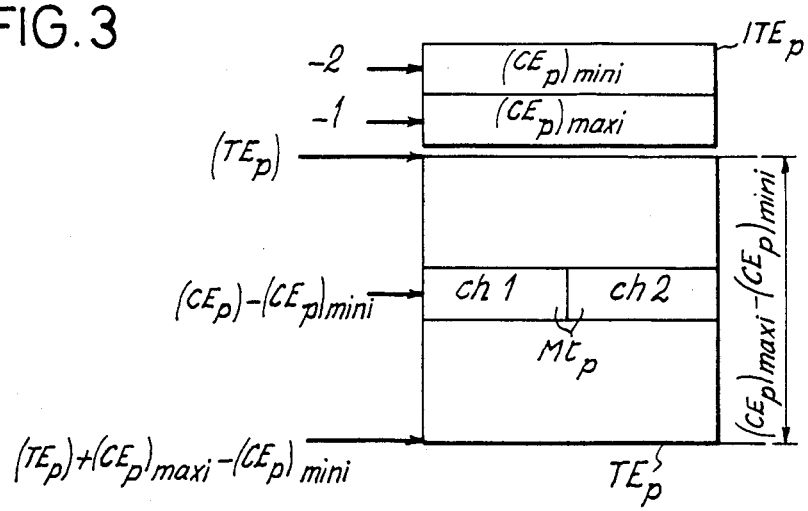
FIG. 3 is a chart to explain the use of an index table in order to reduce the size of the transcoding tables used to identify messages.

As shown in FIG. 3, the position of the index table $ITE_p$ associated to table $TE_p$ is preferably adjacent to table $TE_p$ and precedes it in the device's RAM area. The words ($CE_{pmin}$) and ($CE_{pmax}$) are thus addressed, respectively making a shift of $-2$ and $-1$ in relation to the table start address ($TE_p$) of table $TE_p$.

Figure 4:
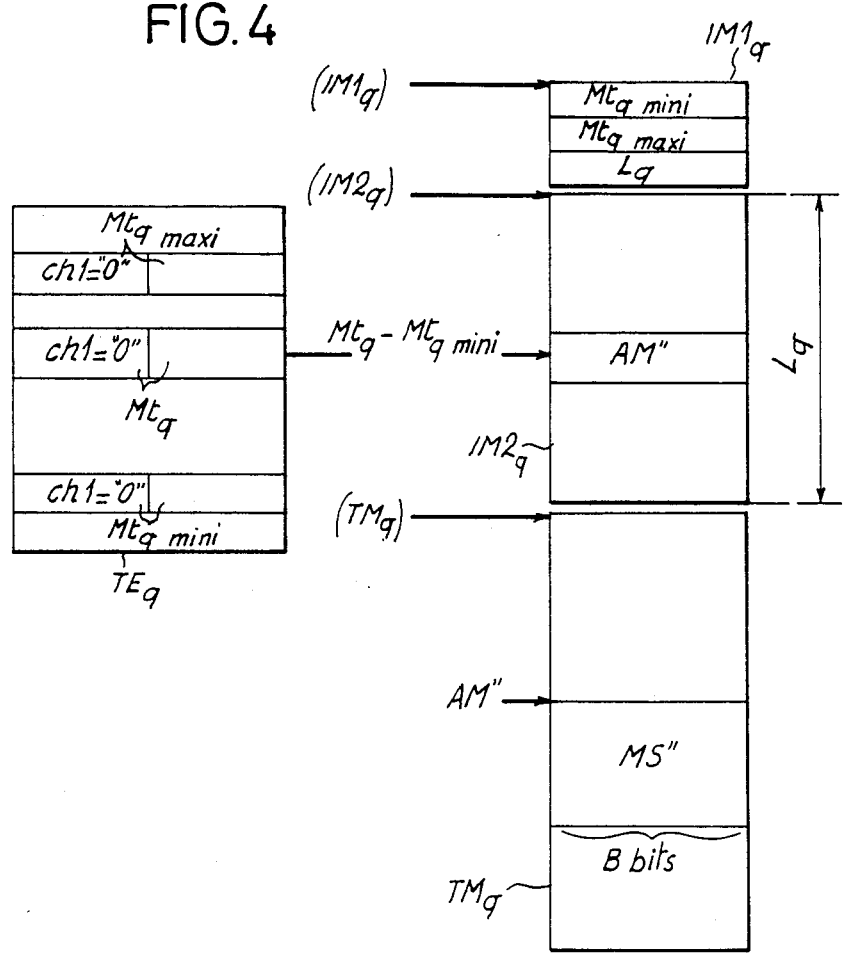
FIG. 4 is a chart showing a preferred organization of transcoding tables storing the transcoded messages in memory.

An incoming word ($CE_p$) read by the CPU is firstly compared to the words ($CE_{pmin}$) and ($CE_{pmax}$) If the incoming word ($CE_p$) is not comprised in the bracket defined by the words ($CE_{pmin}$) and ($CE_{pmax}$), the CPU directly deduces a failure in the transcoding attempt in process. If the incoming word ($CE_p$) is duly comprised between the words ($CE_{pmin}$) and ($CE_{pmax}$), the corresponding transcoding word $Mt_p$ is addressed in the input table $TE_p$ from the table start address ($TE_p$) by the word ($CE_p$)$-$($CE_{pmin}$) corresponding to the numerical difference between the words ($CE_p$) and ($CE_{pmin}$). Message table TM can be replaced by Nmax messages tables $TM_1$ to $TM_{Nmax}$ respectively associated to input tables $TE_1$ and $TE_{Nmax}$. Referring to FIG. 4, an input table $TE_q$ where q is an integer comprised between 1 and Nmax, addresses in the message table $TM_q$ associated to it an outgoing message MS" via the respective index tables $IM1_q$ and $IM2_q$. Index table $IM1_q$ is located by its table start address ($IM1_q$) and consists of three words of B bits $Mt_{qmin}$, $M_{qmax}$ and $L_q$. The word $Mt_{qmin}$ is placed at the table start address ($IM1_q$) and is equal to a minimum transcoding word of the input table $TE_q$ with an indicator ch1="0" and to which an outgoing message in the message table $TM_q$ corresponds. The word $Mt_{qmax}$ is placed at the next address ($IM1_q$)+1 and is equal to a maximum transcoding word of input table $TE_q$ with an indicator ch1="0" and to which an outgoing message in the messages tables $TM_q$ corresponds. The word $L_q$ corresponds to the size of the index table $IM2_q$; it is basically used during the table generation an initialisation phase to check or modify the tables. Index table $IM2_q$ comprises $L_q$ words of B bits. Each of the words in the index table $IM2_q$ is an address of an outgoing message in the corresponding messages tables $TM_q$, in relation to a start address ($TM_q$) of the messages table. Messages table $TM_q$ is located by the table start address ($TM_q$). An outgoing message MS" is addressed in the message table $TM_q$ by an address word AM" stored in index table $IM2_q$. A transcoded word $Mt_q$ of input table $TE_q$ to which an outgoing message MS" corresponds is comprised between words $Mt_{qmin}$ and $Mt_{qmax}$. The CPU, after having checked that the word $Mt_q$ is duly comprised between the words $Mt_{qmin}$ and $Mt_{qmax}$, reads the address word AM" in the index table ($IM2_q$) addressing from the table start address ($IM2_q$) by the numerical difference of the words $Mt_q$ and $Mt_{qmin}$, i.e. $Mt_q - Mt_{qmin}$.

Preferably tables $IM_q$, $IM2_q$ and $TM_q$, are adjacent in the RAM area of the device, as shown in FIG. 4. In fact, the CPU can then deduce the start addresses of the tables ($IM2_q$) and $TM_q$ from the address ($IM1_q$), from the invariable size of table $IM1_q$ fixed at three words, and from the word $L_q$ corresponding to the size of table $IM2_q$, and in this way reduces the number of read operations required to address outgoing messages.

As embodied by the invention, the transcoding device can undergo various modifications to adapt it to different operating modes or to minimize its cost. The exchange management unit 3, in the embodiment just described, can be obtained in wired logic via decoders, flip-flop and logic gates, or included in the CPU providing the exchange management from a microprogram contianed in ROM. In a more perfected embodiment, notably for a bidirectional transcoding device, the exchange management unit can be obtained via a microprocessor type microcontroller, slave of the CPU, and managing the communications independently.

For certain embodiments only requiring a reduced memory area for the transcoding process, the CPU can contain, in ROM, a transcoding table generation software. Microcomputer 6 can then be replaced by a simple dialogue terminal, or a hexadecimal keyboard provided with display units, in order to enter into the transcoding device, various parameters and data to be required relating to systems S1 and S2 and to the required operating mode.

Moreover, when no means for displaying and monitoring transcoding operations in process is necessary, the terminal or microcomputer 4 can
only be connected to the transcoding device during the prior initialization phase, the connection of the terminal to the device being then obtained via interface 1 or 2.

What is claimed is:

1. A method for transcoding incoming word messages having different lengths into transcoded outgoing word messages having different lengths, at least some of the incoming messages being composed of N ordered incoming binary words, N being a variable integer greater than or equal to 1 and representing the length of said incoming message , and at least some of the transcoded outgoing messages being composed of M ordered outgoing binary words, M being a variable integer greater than or equal to 0 and representing the length of transcoded outgoing message, each incoming binary word of an incoming message being used to address in a corresponding transcoding table associated to a rank n of said incoming binary word in said incoming message, where n is an integer between 1 and N, a transcoding word comprising a first field and a second field, in said transcoding table associated to said rank equal to 1, said first field being an indicator identifying said second field as being a transcoded outgoing message having a length M equal to 1 and corresponding to an incoming message having a length equal to 1, or as being an address in a table of transcoded outgoing messages relative to a transcoded outgoing message having a length M different from 1 and corresponding to an incoming message having a length N equal to 1, or as being an address of said transcoding table associated to said rank n equal to 2, in said transcoding tables associated respectively to ranks n different from 1, said first field being an indicator identifying said second field as being an address in said table of transcoded outgoing messages relative to a transcoded outgoing message corresponding to an incoming message having a length N greater than 1, or as being an address of said transcoding table associated to rank n+1, or as being a failure code when said incoming message is not to be transcoded.

2. The method as claimed in claim 1, wherein said table of transcoded outgoing message is divided into as many transcoded outgoing message tables as there are transcoding tables, said transcoded outgoing message tables being respectively associated to said transcoding tables.

3. A method as claimed in claim for incoming binary words comprising a determined integer number of bits B, said transcoding tables comprising at the most $2^{B-1}$ binary transcoding words each with at least B+1 bits.

4. A programmable device for transcoding incoming messages having different lengths into transcoded outgoing word message having different lengths, at least some of the incoming messages being composed of N ordered incoming binary words, N being a variable integer greater than or equal to 1 and representing the length of said incoming message, and at least some of the transcoded outgoing messages being composed of M ordered outgoing binary words, M being a variable integer greater than or equal to 0 and representing the length of said transcoded outgoing message, said device comprising:

first and second interfacing means for connecting said device respectively to first and second incompatible digital systems having to communicate together, via links through which said incoming messages and transcoded outgoing messages transit;

processing means comprising transcoded tables and a programmed algorithm for identifying said incoming messages thereby delivering said transcoded outgoing messages corresponding to said incoming messages;

switching means for connecting alternately said first and second interfacing means to said processing means whereby said processing means receives said incoming messages from said interfacing means and transmits in response to said corresponding transcoded outgoing messages to said interfacing means;

exchange management means for managing said interfacing means and said switching means in terms of a control binary word delivered from said processing means thereby regulating the rate of messages exchanged between said device and said systems in terms of data supplied by said interfacing means; and means for initializing said processing means during a phase prior to transcoding, by loading transcoding tables in a RAM memory included in said processing means, said initializing means displaying data during transcoding.

5. A programmable device for transcoding incoming messages having different lengths into transcoded outgoing word messages having different lengths, at least some of the incoming messages being composed of N ordered incoming binary words, N being a variable integer greater than of equal to 1 and representing the length of said incoming message, and at least some of the transcoded outgoing messages being composed of M ordered outgoing binary words, M being a variable integer greater than or equal to 0 and representing the length of said transcoded outgoing message, said device comprising:

first and second interfacing means for connecting said device respectively to first and second incompatible digital systems having to communicate together, via links through which said incoming messages and transcoded outgoing messages transit;

processing means comprising transcoding tables and a programmed algorithm for identifying said incoming messages thereby delivering said transcoded outgoing messages corresponding to said incoming messages;

switching means for connecting alternately said first and second interfacing means to said processing means whereby said processing means receives said incoming messages from said interfacing means and transmits in response to said corresponding transcoded outgoing message to said interfacing means;

exchange management means for managing said interfacing means and said switching means in terms of a control binary word delivered from said processing means thereby regulating the rate of messages exchanged between said device and said systems in terms of data supplied by said interfacing means; and means for initializing said processing means during a phase prior to transcoding, by loading transcoding tables in a RAM memory comprised in said processing means, said initializing means including a microcomputer, terminal, or hexadecimal keyboard comprising display units.

* * * * *